United States Patent
Kam

(10) Patent No.: US 10,278,143 B2
(45) Date of Patent: Apr. 30, 2019

(54) METHOD AND ELECTRONIC DEVICE FOR MINIMIZING NOISE IN POWER AMPLIFIER

(71) Applicant: Samsung Electronics Co., Ltd., Suwon-si, Gyeonggi-do (KR)

(72) Inventor: Sangho Kam, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/851,629

(22) Filed: Dec. 21, 2017

(65) Prior Publication Data

US 2018/0184388 A1 Jun. 28, 2018

(30) Foreign Application Priority Data

Dec. 26, 2016 (KR) ........................ 10-2016-0179075

(51) Int. Cl.

| | | |
|---|---|---|
| H04W 52/52 | (2009.01) | |
| H03F 3/21 | (2006.01) | |
| H03F 1/02 | (2006.01) | |
| H03F 3/19 | (2006.01) | |
| H03F 1/26 | (2006.01) | |
| H04W 52/02 | (2009.01) | |
| H04B 1/04 | (2006.01) | |
| H04W 52/24 | (2009.01) | |
| H03F 3/24 | (2006.01) | |
| H04W 52/54 | (2009.01) | |

(52) U.S. Cl.
CPC .......... *H04W 52/52* (2013.01); *H03F 1/0205* (2013.01); *H03F 1/0211* (2013.01); *H03F 1/26* (2013.01); *H03F 3/19* (2013.01); *H03F 3/21* (2013.01); *H03F 3/245* (2013.01); *H04B 1/0475* (2013.01); *H04W 52/0238* (2013.01); *H04W 52/245* (2013.01); *H03F 2200/102* (2013.01); *H03F 2200/105* (2013.01); *H03F 2200/451* (2013.01); *H03F 2200/511* (2013.01); *H04B 2001/045* (2013.01)

(58) Field of Classification Search
CPC ............. H04W 52/52; H04W 52/0238; H04W 52/245; H03F 1/0205; H03F 1/26; H03F 3/19; H03F 3/21; H03F 220/102; H03F 220/105; H03F 220/451; H04B 1/0475; H04B 2001/045
USPC ....................................... 455/114.2
See application file for complete search history.

(56) References Cited

U.S. PATENT DOCUMENTS

| | | | | |
|---|---|---|---|---|
| 6,356,745 | B1 * | 3/2002 | Lee ..................... | H04W 52/367 330/129 |
| 7,623,896 | B2 * | 11/2009 | Tanaka ................ | H03G 1/0088 330/297 |
| 2014/0155127 | A1 * | 6/2014 | Dakshinamurthy ......................... | H04W 52/028 455/574 |
| 2016/0099687 | A1 | 4/2016 | Khlat | |
| 2016/0174153 | A1 | 6/2016 | Balteanu et al. | |

\* cited by examiner

*Primary Examiner* — Lee Nguyen

(57) ABSTRACT

According to certain embodiments, a method of operating an electronic device includes identifying an RSSI value and setting a power amplifier to a first power amplification mode or a second power amplification mode based on the identified one or more RSSI value, wherein the first power amplification mode and the second power amplification mode supply different supply voltages to the power amplifier.

14 Claims, 11 Drawing Sheets

METHOD AND ELECTRONIC DEVICE FOR MINIMIZING NOISE IN POWER AMPLIFIER

CROSS-REFERENCE TO RELATED APPLICATION(S)

This application is related to and claims priority to Korean Patent Application No. 10-2016-0179075 filed Dec. 26, 2016, the contents of which are incorporated herein by reference.

TECHNICAL FIELD

Various embodiments of the present disclosure relate to a method for minimizing noise in a power amplifier and an electronic device supporting the same.

BACKGROUND

As electronic devices are increasingly used, technology for increasing a battery capacity or optimizing battery power consumption is developing, and technology for optimizing power consumption in wireless communication systems to reduce battery power consumption is developing. Envelope tracking (ET) technology and average power tracking (APT) technology are used to optimize power consumption of a power amplifier constituting part of a wireless communication system. The ET technology and the APT technology achieve high efficiency by reducing power loss by changing a supply voltage to the power amplifier according to output power of the power amplifier.

The ET technology may not provide a capacitor which is typically arranged at a bias voltage input terminal of a power amplifier to apply an alternating current voltage and to remove a noise. Accordingly, since the capacitor typically arranged at the bias voltage input terminal is not provided for the sake of minimizing power consumption in a wireless communication system, there may be a problem that the power amplifier is vulnerable to noise.

SUMMARY

To address the above-discussed deficiencies, it is a primary object to provide a method for minimizing noise while reducing power consumption of a power amplifier, and an electronic device supporting the same.

The objectives that are intended to be addressed by the present disclosure are not limited to those mentioned above, and other objectives that are not mentioned above may be clearly understood to those skilled in the art based on the description provided below.

According to an aspect of the present disclosure, there is provide an operation method of an electronic device including: identifying a received signal strength indicator (RSSI) value; and setting a power amplifier to a first power amplification mode or a second power amplification mode based on the identified one or more RSSI value, wherein the first power amplification mode and the second power amplification mode supply different supply voltages to the power amplifier.

According to another aspect of the present disclosure, there is provided an electronic device including: an antenna functionally connected to the electronic device; and a processor, the processor configured to identify an RSSI value using the antenna, and to set a power amplifier to a first power amplification mode or a second power amplification mode based on the identified one or more RSSI value, wherein the first power amplification mode and the second power amplification mode supply different supply voltages to the power amplifier.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
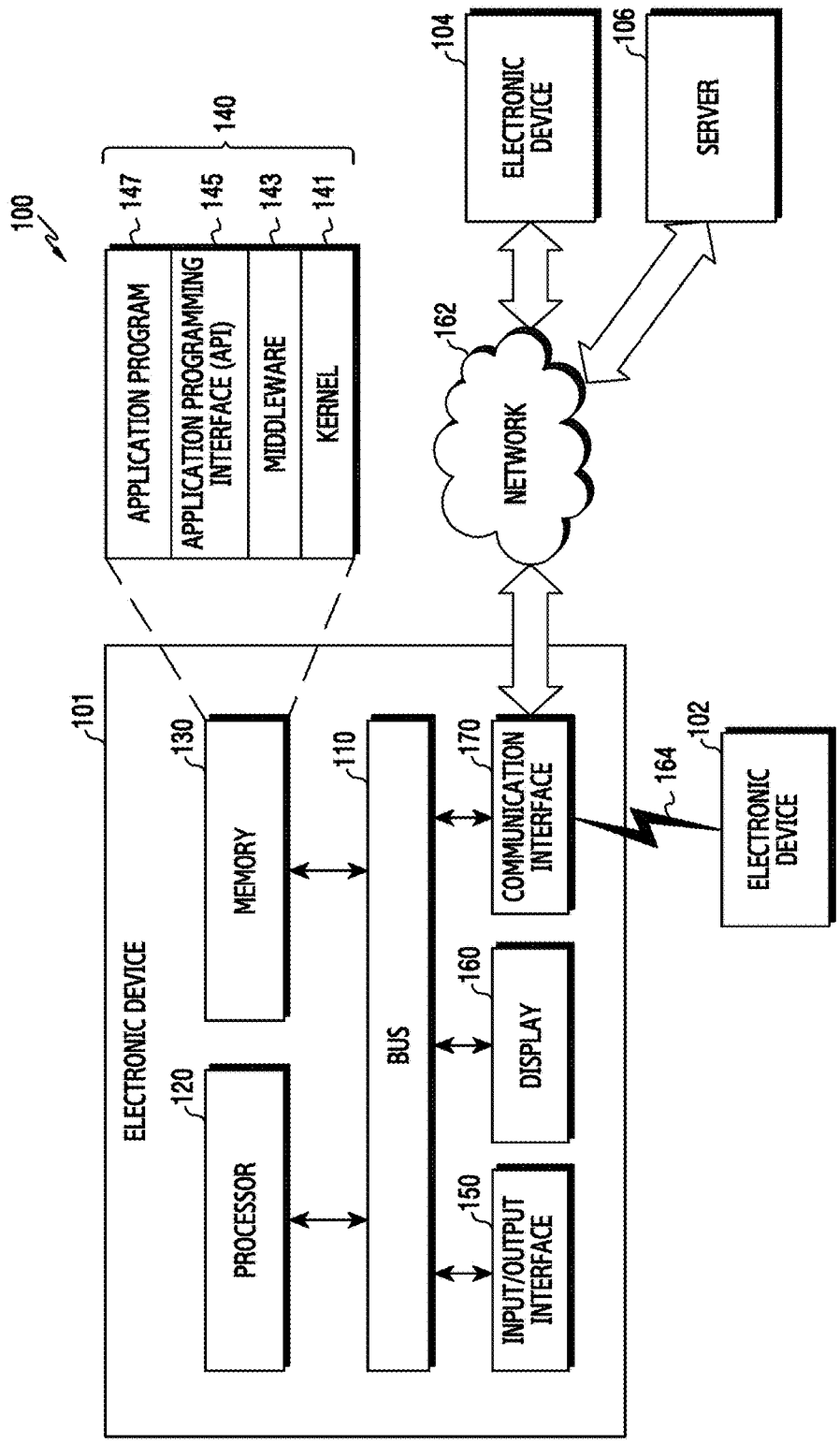
FIG. 1 illustrates an environment of a network including an electronic device according to various embodiments of the present disclosure.

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various exemplary embodiments of the present disclosure will be described with reference to the accompanying drawings. However, it should be understood that there is no intent to limit the present disclosure to the particular forms disclosed herein; rather, the present disclosure should be understood to cover various modifications, equivalents, and/or alternatives of the various exemplary embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including both at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), the element may be directly connected or coupled directly to the other element or any other element (e.g., third element) may be interposed between them. Additionally, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may refer, for example, to a situation in which the device, together with other devices or components, "is able to". For example, the phrase "processor adapted (or configured) to perform A, B, and C" may refer, for example, to a dedicated processor (e.g. embedded processor) for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even when the term is defined in the present disclosure, the term should not be interpreted to exclude embodiments of the present disclosure.

An electronic device according to various exemplary embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device, or the like, but is not limited thereto. According to various exemplary embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit), or the like, but is not limited thereto.

According to some exemplary embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HOMESYNC, APPLE TV, or GOOGLE TV), a game console (e.g., XBOX and PLAY- STATION), an electronic dictionary, an electronic key, a camcorder, and an electronic photo frame, or the like, but is not limited thereto.

According to another exemplary embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.), or the like, but is not limited thereto.

According to some exemplary embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter), or the like, but is not limited thereto. The electronic device according to various exemplary embodiments of the present disclosure may be a combination of one or more of the aforementioned various devices. The electronic device according to some embodiments of the present disclosure may be a flexible device. Further, the electronic device according to some exemplary embodiments of the present disclosure is not limited to the aforementioned devices, and may include a new electronic device according to the development of technology.

Hereinafter, an electronic device according to various exemplary embodiments will be described with reference to the accompanying drawings. As used herein, the term "user" may indicate a person who uses an electronic device or a device (e.g., an artificial intelligence electronic device) that uses an electronic device.

FIG. 1 illustrates an example of a network environment including an example of an electronic device according to various exemplary embodiments of the present disclosure.

An electronic device 101 within a network environment 100, according to various embodiments, will be described with reference to FIG. 1. The electronic device 101 may include a bus 110, a processor (e.g., including processing circuitry) 120, a memory 130, an input/output interface (e.g., including interface circuitry) 150, a display 160, and a communication interface (e.g., including communication circuitry) 170. In some embodiments, the electronic device 101 may omit at least one of the above elements or may further include other elements.

The bus 110 may include, for example, a circuit for connecting the elements 110-170 and transferring communication (e.g., control messages and/or data) between the elements.

The processor 120 may include various processing circuitry, such as, for example, and without limitation, one or more of a dedicated processor, a Central Processing Unit (CPU), an Application Processor (AP), and a Communication Processor (CP). The processor 120, for example, may carry out operations or data processing relating to control and/or communication of at least one other element of the electronic device 101.

The memory 130 may include a volatile memory and/or a non-volatile memory. The memory 130 may store, for example, instructions or data relevant to at least one other element of the electronic device 101. According to an embodiment, the memory 130 may store software and/or a program 140. The program 140 may include, for example, a kernel 141, middleware 143, an Application Programming Interface (API) 145, and/or application programs (or "applications") 147. At least some of the kernel 141, the middleware 143, and the API 145 may be referred to as an Operating System (OS).

The kernel 141 may control or manage system resources (e.g., the bus 110, the processor 120, or the memory 130) used for performing an operation or function implemented by the other programs (e.g., the middleware 143, the API 145, or the application programs 147). Furthermore, the kernel 141 may provide an interface through which the middleware 143, the API 145, or the application programs 147 may access the individual elements of the electronic device 101 to control or manage the system resources.

The middleware 143, for example, may function as an intermediary for allowing the API 145 or the application programs 147 to communicate with the kernel 141 to exchange data.

In addition, the middleware 143 may process one or more operation requests received from the application program 147 according to priority. For example, the middleware 143 may give priority to use the system resources of the electronic device 101 (for example, the bus 110, the processor 120, the memory 130, and the like) to at least one of the application programs 147. For example, the middleware 143 may perform scheduling or load balancing with respect to the one or more operation requests by processing the one or more operation requests according to the priority given to the at least one application program.

The API 145 is an interface through which the application programs 147 control functions provided from the kernel 141 or the middleware 143, and may include, for example, at least one interface or function (e.g., instruction) for file control, window control, image processing, or text control.

The input/output interface 150, for example, may include various interface circuitry and function as an interface that may transfer instructions or data input from a user or another external device to the other element(s) of the electronic device 101. Furthermore, the input/output interface 150 may output the instructions or data received from the other element(s) of the electronic device 101 to the user or another external device.

The display 160 may include, for example, a Liquid Crystal Display (LCD), a Light Emitting Diode (LED) display, an Organic Light Emitting Diode (OLED) display, a Micro Electro Mechanical System (MEMS) display, or an electronic paper display, or the like, but is not limited thereto. The display 160, for example, may display various types of content (e.g., text, images, videos, icons, or symbols) for the user. The display 160 may include a touch screen and receive, for example, a touch, gesture, proximity, or hovering input using an electronic pen or the user's body part.

The communication interface 170, for example, may include various communication circuitry and set communication between the electronic device 101 and an external device (e.g., the first external electronic device 102, the second external electronic device 104, or a server 106). For example, the communication interface 170 may be connected to a network 162 through wireless or wired communication to communicate with the external device (e.g., the second external electronic device 104 or the server 106).

The wireless communication may use at least one of, for example, Long Term Evolution (LTE), LTE-Advance (LTE-A), Code Division Multiple Access (CDMA), Wideband CDMA (WCDMA), Universal Mobile Telecommunications System (UMTS), WiBro (Wireless Broadband), and Global System for Mobile Communications (GSM), as a cellular communication protocol. In addition, the wireless communication may include, for example, short-range communication 164. The short-range communication 164 may be performed by using at least one of, for example, Wi-Fi, Bluetooth®, Bluetooth® low energy (BLE), Near Field Communication (NFC), and Global Navigation Satellite System (GNSS). The GNSS may include at least one of, for example, a Global Positioning System (GPS), a Global Navigation Satellite System (Glonass), a Beidou Navigation Satellite System (hereinafter referred to as "Beidou"), and a European Global Satellite-based Navigation System (Galileo), according to a use area, a bandwidth, or the like. Hereinafter, in the present disclosure, the "GPS" may be interchangeably used with the "GNSS". The wired communication may include at least one of, for example, a Universal Serial Bus (USB), a High Definition Multimedia Interface (HDMI), Recommended Standard 232 (RS-232), and a Plain Old Telephone Service (POTS). The network 162 may include at least one of a communication network such as a computer network (e.g., a LAN or a WAN), the Internet, and a telephone network.

Each of the first and second external electronic devices 102 and 104 may be of a type identical to or different from that of the electronic device 101. According to an embodiment, the server 106 may include a group of one or more servers. According to various embodiments, all or some of the operations performed in the electronic device 101 may be performed in another electronic device or a plurality of electronic devices (e.g., the electronic devices 102 and 104 or the server 106). According to an embodiment, when the electronic device 101 has to perform some functions or services automatically or in response to a request, the electronic device 101 may make a request for performing at least some functions relating thereto to another device (e.g., the external electronic device 102 or 104 or the server 106). The electronic device 101 can perform the functions or services by itself or in addition to another device (e.g., the external electronic device 102 or 104 or the server 106). Another electronic apparatus may execute the requested functions or the additional functions, and may deliver a result of the execution to the electronic device 101. The electronic device 101 may process the received result or provide the requested functions or services. To achieve this, for example, cloud computing, distributed computing, or client-server computing technology may be used.

Figure 2:
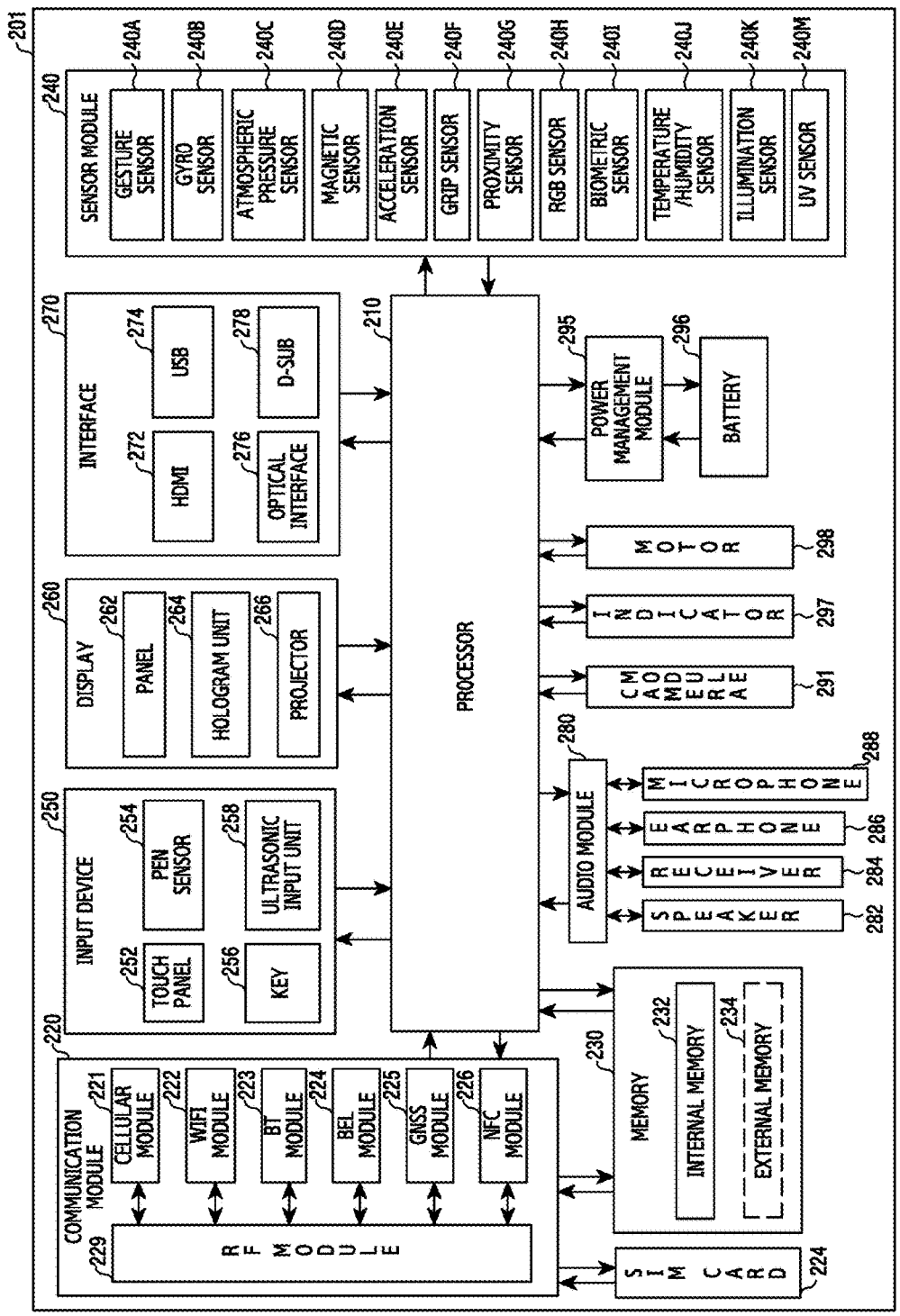
FIG. 2 illustrates a block diagram of an electronic device according to various embodiments of the present disclosure.

FIG. 2 is a block diagram illustrating an example of an electronic device according to various exemplary embodiments of the present disclosure.

FIG. 2 illustrates a block diagram of an electronic device 201 according to various exemplary embodiments. For example, the electronic device 201 may include the whole or part of the electronic device 101 illustrated in FIG. 1. The electronic device 201 may include at least one processor (e.g., Application Processor (AP)) (e.g., including processing circuitry) 210, a communication module (e.g., including communication circuitry) 220, a Subscriber Identification Module (SIM) 224, a memory 230, a sensor module 240, an input device (e.g., including input circuitry) 250, a display 260, an interface (e.g., including interface circuitry) 270, an audio module 280, a camera module 291, a power management module 295, a battery 296, an indicator 297, and a motor 298.

The processor 210 may include various processing circuitry and control a plurality of hardware or software components connected to the processor 210 by driving an operating system or an application program and perform processing of various pieces of data and calculations. The processor 210 may be implemented by, for example, a System on Chip (SoC). According to an embodiment, the processor 210 may further include a Graphic Processing Unit (GPU) and/or an image signal processor. The processor 210 may include at least some (e.g., a cellular module 221) of the elements illustrated in FIG. 2. The processor 210 may load, into a volatile memory, instructions or data received from at least one (e.g., a non-volatile memory) of the other elements and may process the loaded instructions or data, and may store various data in a non-volatile memory.

The communication module 220 may have a configuration equal or similar to that of the communication interface 170 of FIG. 1. The communication module 220 may include various communication circuitry, such as, for example, and without limitation, the cellular module 221, a Wi-Fi module 223, a Bluetooth® (BT) module 225, a GNSS module 227 (e.g., a GPS module, a Glonass module, a Beidou module, or a Galileo module), an NFC module 228, and a Radio Frequency (RF) module 229.

The cellular module 221 may provide a voice call, image call, a text message service, or an Internet service through, for example, a communication network. According to an embodiment, the cellular module 221 may distinguish between and authenticate electronic devices 201 within a communication network using a subscriber identification module (for example, the SIM card 224). According to an embodiment of the present disclosure, the cellular module 221 may perform at least some of the functions that the processor 210 may provide. According to an embodiment, the cellular module 221 may include a Communication Processor (CP).

Each of the Wi-Fi module 223, the BT module 225, the GNSS module 227, and the NFC module 228 may include, for example, a processor for processing data transmitted and received through the relevant module. According to some embodiments of the present disclosure, at least some (e.g., two or more) of the cellular module 221, the Wi-Fi module 223, the BT module 225, the GNSS module 227, and the NFC module 228 may be included in one Integrated Chip (IC) or IC package.

The RF module 229 may transmit/receive, for example, a communication signal (for example, an RF signal). The RF module 229 may include, for example, a transceiver, a Power Amplifier Module (PAM), a frequency filter, a Low Noise Amplifier (LNA), and an antenna. According to another embodiment of the present disclosure, at least one of the cellular module 221, the Wi-Fi module 223, the BT module 225, the GNSS module 227, and the NFC module 228 may transmit and receive RF signals through a separate RF module.

The SIM 224 may include, for example, a card including a subscriber identity module and/or an embedded SIM, and may contain unique identification information (e.g., an Integrated Circuit Card Identifier (ICCID)) or subscriber information (e.g., an International Mobile Subscriber Identity (IMSI)).

The memory 230 (for example, the memory 130 of FIG. 1) may include, for example, an internal memory 232 and/or an external memory 234. The internal memory 232 may include at least one of a volatile memory (for example, a Dynamic Random Access Memory (DRAM), a Static RAM (SRAM), a Synchronous Dynamic RAM (SDRAM), and the like) and a non-volatile memory (for example, a One Time Programmable Read Only Memory (OTPROM), a Programmable ROM (PROM), an Erasable and Programmable ROM (EPROM), an Electrically Erasable and Programmable ROM (EEPROM), a mask ROM, a flash ROM, a flash memory (for example, a NAND flash memory or a NOR flash memory), a hard disc drive, a Solid State Drive (SSD), and the like).

The external memory 234 may further include a flash drive, for example, a Compact Flash (CF), a Secure Digital (SD), a Micro Secure Digital (Micro-SD), a Mini Secure Digital (Mini-SD), an eXtreme Digital (xD), a memory stick, or the like. The external memory 234 may be functionally and/or physically connected to the electronic device 201 through various interfaces.

The sensor module 240 may measure a physical quantity or detect an operation state of the electronic device 201, and may convert the measured or detected information into an electrical signal. For example, the sensor module 240 may include at least one of a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (for example, a Red/Green/Blue (RGB) sensor), a biometric sensor 240I, a temperature/humidity sensor 240J, a light sensor 240K, and an Ultra Violet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an Infrared (IR) sensor, an iris sensor, and/or a fingerprint sensor. The sensor module 240 may further include a control circuit for controlling one or more sensors included therein. In some embodiments of the present disclosure, the electronic device 201 may further include a processor configured to control the sensor module 240 as a part of or separately from the processor 210, and may control the sensor module 240 while the processor 210 is in a sleep state.

The input device 250 may include various input circuitry, such as, for example, and without limitation, a touch panel 252, a (digital) pen sensor 254, a key 256, or an ultrasonic input device 258. The touch panel 252 may use at least one of, for example, a capacitive type, a resistive type, an infrared type, and an ultrasonic type. Also, the touch panel 252 may further include a control circuit. The touch panel 252 may further include a tactile layer and provide a tactile reaction to the user.

The (digital) pen sensor 254 may include, for example, a recognition sheet which is a part of the touch panel or is separated from the touch panel. The key 256 may include, for example, a physical button, an optical key or a keypad. The ultrasonic input device 258 may detect ultrasonic wavers generated by an input tool through a microphone (for example, a microphone 288) and identify data corresponding to the detected ultrasonic waves.

The display 260 (for example, the display 160) may include a panel 262, a hologram unit 264 or a projector 266. The panel 262 may include a configuration that is identical or similar to the display 160 illustrated in FIG. 1. The panel 262 may be implemented to be, for example, flexible, transparent, or wearable. The panel 262 and the touch panel 252 may be implemented as one module. The hologram unit 264 may show a three dimensional image in the air by using an interference of light. The projector 266 may display an image by projecting light onto a screen. The screen may be located, for example, inside or outside the electronic device 201. According to an embodiment, the display 260 may further include a control circuit for controlling the panel 262, the hologram unit 264, or the projector 266.

The interface 270 may include various interface circuitry, such as, for example, and without limitation, a High-Definition Multimedia Interface (HDMI) 272, a Universal Serial Bus (USB) 274, an optical interface 276, or a D-subminiature (D-sub) 278. The interface 270 may be included in, for example, the communication interface 170 illustrated in FIG. 1. Additionally or alternatively, the interface 270 may include, for example, a Mobile High-definition Link (MHL) interface, a Secure Digital (SD) card/Multi-Media Card (MMC) interface, or an Infrared Data Association (IrDA) standard interface.

The audio module 280 may bilaterally convert, for example, a sound and an electrical signal. At least some elements of the audio module 280 may be included in, for example, the input/output interface 150 illustrated in FIG. 1. The audio module 280 may process sound information which is input or output through, for example, a speaker 282, a receiver 284, earphones 286, the microphone 288 or the like.

The camera module 291 is a device which may photograph a still image and a dynamic image. According to an embodiment, the camera module 291 may include one or more image sensors (for example, a front sensor or a back sensor), a lens, an Image Signal Processor (ISP) or a flash (for example, LED or xenon lamp).

The power management module 295 may manage, for example, power of the electronic device 201. According to an embodiment, the power management module 295 may include a Power Management Integrated Circuit (PMIC), a charger Integrated Circuit (IC), or a battery or fuel gauge. The PMIC may use a wired and/or wireless charging method. Examples of the wireless charging method may include, for example, a magnetic resonance method, a magnetic induction method, an electromagnetic method, and the like. Additional circuits (e.g., a coil loop, a resonance circuit, a rectifier, etc.) for wireless charging may be further included. The battery gauge may measure, for example, a residual quantity of the battery 296, and a voltage, a current, or a temperature during the charging. The battery 296 may include, for example, a rechargeable battery or a solar battery.

The indicator 297 may display a particular state (e.g., a booting state, a message state, a charging state, or the like) of the electronic device 201 or a part (e.g., the processor 210). The motor 298 may convert an electrical signal into mechanical vibration, and may generate vibration, a haptic effect, or the like. Although not illustrated, the electronic device 201 may include a processing unit (e.g., a GPU) for supporting a mobile television (TV). The processing unit for supporting mobile TV may, for example, process media data according to a certain standard such as Digital Multimedia Broadcasting (DMB), Digital Video Broadcasting (DVB), or MediaFLO™.

Each of the above-described component elements of hardware according to the present disclosure may be configured with one or more components, and the names of the corresponding component elements may vary based on the type of electronic device. The electronic device according to various embodiments of the present disclosure may include at least one of the aforementioned elements. Some elements may be omitted or other additional elements may be further included in the electronic device. Also, some of the hardware components according to various embodiments may be combined into one entity, which may perform functions identical to those of the relevant components before the combination.

Figure 3:
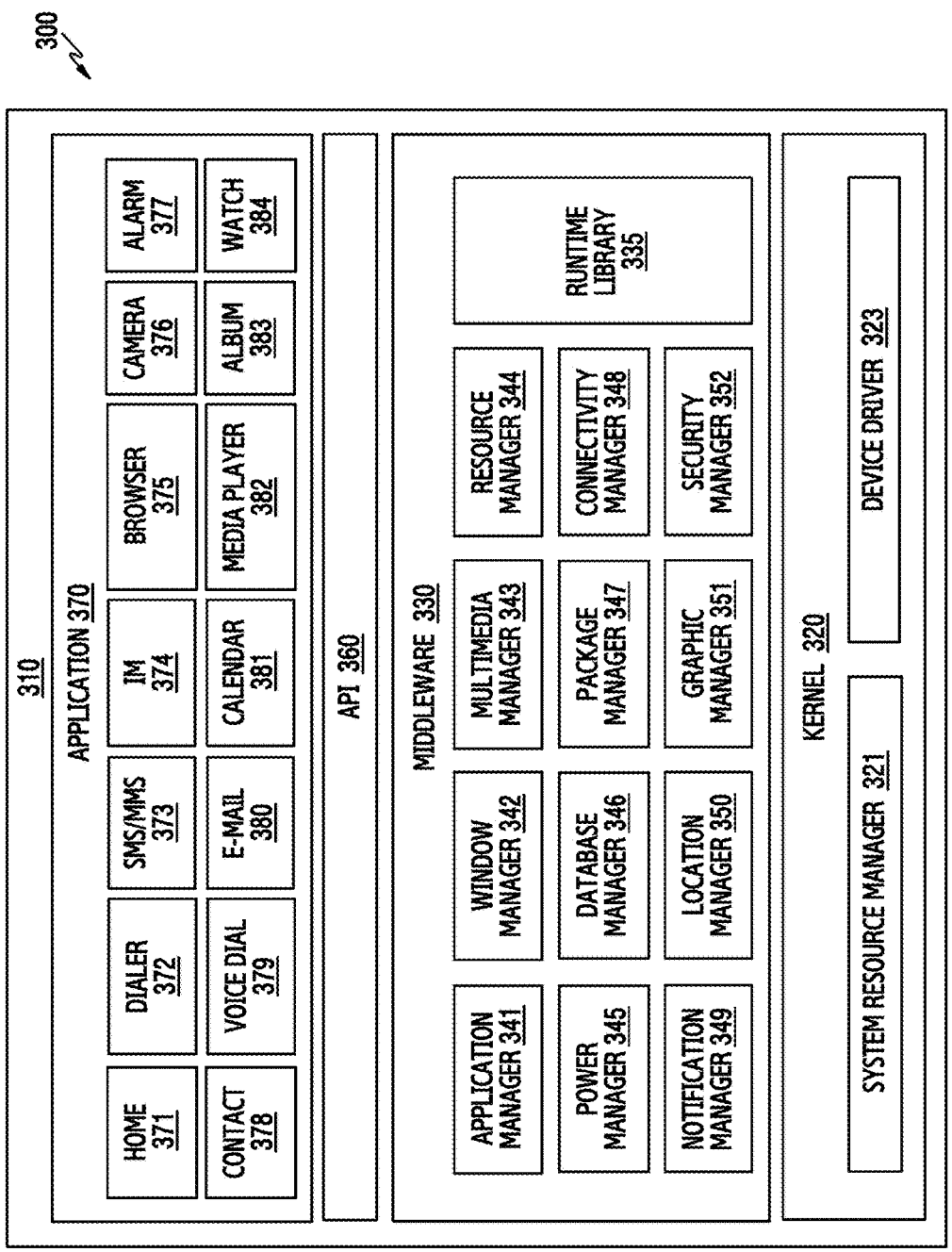
FIG. 3 illustrates a block diagram of a program module according to various embodiments.

FIG. 3 illustrates a block diagram of an example of a program module according to various exemplary embodiments of the present disclosure.

According to an embodiment, the program module 310 (for example, the program 140) may include an Operating System (OS) for controlling resources related to the electronic device (for example, the electronic device 101) and/or various applications (for example, the application programs 147) executed in the operating system. The operating system may be, for example, Android, iOS, Windows, Symbian, Tizen, Bada, or the like.

The program module 310 may include a kernel 320, middleware 330, an API 360, and/or an application 370. At least some of the program module 310 may be preloaded on the electronic apparatus, or may be downloaded from an external electronic apparatus (e.g., the electronic device 102 or 104, or the server 106).

The kernel 320 (e.g., the kernel 141) may include, for example, a system resource manager 321 and/or a device driver 323. The system resource manager 321 may perform the control, allocation, retrieval, or the like of system resources. According to an embodiment of the present disclosure, the system resource manager 321 may include a process manager, a memory manager, a file system manager, or the like. The device driver 323 may include, for example, a display driver, a camera driver, a Bluetooth driver, a shared memory driver, a USB driver, a keypad driver, a Wi-Fi driver, an audio driver, or an Inter-Process Communication (IPC) driver.

The middleware 330 may provide a function that is used by the applications 370 in common or provide various functions to the applications 370 through the API 360 so that the applications 370 can efficiently use limited system resources within the electronic device. According to one exemplary embodiment, the middleware 330 (for example, the middleware 143) may include, for example, at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include a library module that a compiler uses in order to add a new function through a programming language while the applications 370 are being executed. The runtime library 335 may perform input/output management, memory management, the functionality for an arithmetic function, or the like.

The application manager 341 may manage, for example, the life cycle of at least one of the applications 370. The window manager 342 may manage Graphical User Interface (GUI) resources used for the screen. The multimedia manager 343 may determine a format used to reproduce various media files, and may encode or decode a media file by using a coder/decoder (codec) appropriate for the relevant format. The resource manager 344 may manage resources, such as a source code, a memory, a storage space, and the like of at least one of the applications 370.

The power manager 345 may operate together with a Basic Input/Output System (BIOS) to manage a battery or power and may provide power information for the operation of the electronic device. The database manager 346 may generate, search for, and/or change a database to be used by at least one of the applications 370. The package manager 347 may manage the installation or update of an application distributed in the form of a package file.

The connectivity manager 348 may manage a wireless connection such as, for example, Wi-Fi or Bluetooth. The notification manager 349 may display or notify of an event, such as an arrival message, an appointment, a proximity notification, and the like, in such a manner as not to disturb the user. The location manager 350 may manage location information of the electronic apparatus. The graphic manager 351 may manage a graphic effect, which is to be provided to the user, or a user interface related to the graphic effect. The security manager 352 may provide various security functions for system security, user authentication, and the like. According to an embodiment of the present disclosure, when the electronic apparatus (e.g., the electronic device 101) includes a telephone call function, the middleware 330 may further include a telephony manager for managing a voice call function or a video call function of the electronic apparatus.

The middleware 330 may include a middleware module that forms a combination of various functions of the above-described elements. The middleware 330 may provide a module specialized for each type of OS in order to provide a differentiated function. Also, the middleware 330 may dynamically delete some of the existing elements, or may add new elements.

The API 360 (e.g., the API 145) is, for example, a set of API programming functions, and may be provided with a different configuration according to an OS. For example, in the case of Android or iOS, one API set may be provided for each platform. In the case of Tizen, two or more API sets may be provided for each platform.

The applications 370 (for example, the application program 147) may include, for example, one or more applications which can provide functions such as home 371, dialer 372, SMS/MMS 373, Instant Message (IM) 374, browser 375, camera 376, alarm 377, contacts 378, voice dialer 379, email 380, calendar 381, media player 382, album 383, clock 384, health care (for example, measure exercise quantity or blood sugar), or environment information (for example, atmospheric pressure, humidity, or temperature information).

According to an embodiment of the present disclosure, the applications 370 may include an application (hereinafter, referred to as an "information exchange application" for convenience of description) supporting information exchange between the electronic apparatus (e.g., the electronic device 101) and an external electronic device (e.g., the electronic device 102 or 104). The application associated with information exchange may include, for example, a notification relay application for forwarding specific information to an external electronic device, or a device management application for managing an external electronic device.

For example, the notification relay application may include a function of delivering, to the external electronic apparatus (e.g., the electronic device 102 or 104), notification information generated by other applications (e.g., an SMS/MMS application, an email application, a health care application, an environmental information application, etc.) of the electronic device 101. Further, the notification relay application may receive notification information from, for example, an external electronic device and provide the received notification information to a user.

The device management application may manage (for example, install, delete, or update), for example, a function for at least a part of the external electronic device (for example, the electronic device 102 or 104) communicating with the electronic device (for example, turning on/off the external electronic device itself (or some elements thereof) or adjusting brightness (or resolution) of a display), applications executed in the external electronic device, or services provided from the external electronic device (for example, a telephone call service or a message service).

According to an embodiment, the applications 370 may include applications (for example, a health care application of a mobile medical appliance or the like) designated according to attributes of the external electronic device 102 or 104. According to an embodiment of the present disclosure, the application 370 may include an application received from the external electronic apparatus (e.g., the server 106, or the electronic device 102 or 104). According to an embodiment of the present disclosure, the application 370 may include a preloaded application or a third party application which can be downloaded from the server. Names of the elements of the program module 310, according to the above-described embodiments of the present disclosure, may change depending on the type of OS.

According to various embodiments of the present disclosure, at least some of the program module 310 may be implemented in software, firmware, hardware, or a combination of two or more thereof. At least some of the program module 310 may be implemented (e.g., executed) by, for example, the processor (e.g., the processor 210). At least some of the program module 310 may include, for example, a module, a program, a routine, a set of instructions, and/or a process for performing one or more functions.

The term "module" as used herein may, for example, refer to a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of a dedicated processor, a CPU, an Application-Specific Integrated Circuit (ASIC) chip, a Field-Programmable Gate Arrays (FPGA), and a programmable-logic device for performing operations.

According to various exemplary embodiments, at least some of the devices (for example, modules or functions thereof) or the method (for example, operations) according to the present disclosure may be implemented by a command stored in a computer-readable storage medium in a programming module form. The instruction, when executed by a processor (e.g., the processor 120), may cause the one or more processors to execute the function corresponding to the instruction. The computer-readable storage medium may be, for example, the memory 130.

According to various embodiments of the present disclosure, an electronic device may include an antenna functionally connected to the electronic device, and a processor. The processor may be configured to identify an RSSI value using the antenna, and to set a power amplifier to a first power amplification mode or a second power amplification mode based on the identified one or more RSSI value, and the first power amplification mode and the second power amplification mode may supply different supply voltages to the power amplifier.

In one embodiment, the first power amplification mode may be an ET mode, and the second power amplification mode is an APT mode. The processor may be configured to, in the ET mode, amplify power of a transmission signal using a first supply voltage which is generated based on an envelope signal of the transmission signal, and, in the APT mode, to amplify the power of the transmission signal using a second supply voltage which is generated based on an average of an amplitude component of the envelope signal of the transmission signal.

In one embodiment, the processor may be configured to set the power amplifier to the first power amplification mode, to compare the identified RSSI value and a reference value, and, when the identified RSSI value is less than the reference value, to change the power amplifier to the second power amplification mode.

In one embodiment, the processor may be configured to, when the identified RSSI value is greater than or equal to the reference value, maintain the first power amplification mode of the power amplifier.

In one embodiment, the processor may be configured to compare an RSSI value which is identified after the power amplifier is set to the second power amplification mode, and the reference value, and, when the RSSI value which is identified after the power amplifier is set to the second power amplification mode is greater than or equal to the reference value, to change the power amplifier to the first power amplification mode.

In one embodiment, the processor may be configured to set the power amplifier to the first power amplification mode, to compare the identified RSSI value and a reference value, to compare a difference value between the identified RSSI value and the reference value and a value within a predetermined range, when the identified RSSI value is less than the reference value and the difference value is greater than the value within the predetermined range, to set the power amplifier to the second power amplification mode and, when the identified RSSI value is less than the reference value and the difference value is the value within the predetermined range, to maintain the power amplifier in the first power amplification mode.

In one embodiment, the processor may be configured to set the power amplifier to the first power amplification mode, to detect a difference value between a first RSSI value and a second RSSI value which are identified, to compare the difference value between the first RSSI value and the second RSSI value and a reference value, and, when the difference value between the first RSSI value and the second RSSI value is greater than the reference value, to change the power amplifier to the second power amplification mode.

In one embodiment, the processor may be configured to, when the difference value between the first RSSI value and the second RSSI value is less than or equal to the reference value, maintain the power amplifier in the first power amplification mode.

In one embodiment, the processor may be configured to detect a difference value between a first RSSI value and a second RSSI value which are identified after the power amplifier is set to the second power amplification mode, to compare the difference value which is detected after the power amplifier is set to the second power amplification mode and the reference value, and when the difference value which is detected after the power amplifier is set to the second power amplification mode is less than or equal to the reference value, to change the power amplifier to the first power amplification mode.

In one embodiment, the processor may be configured to, when a number of times a mode is changed to the APT mode or the ET mode for a predetermined time is greater than or equal to a reference number of times, select the ET mode.

In one embodiment, the antenna may include a first antenna and a second antenna.

In one embodiment, the processor may be configured to identify the RSSI value using at least one of the first antenna and the second antenna.

In one embodiment, the processor may be configured to identify a first RSSI value using the first antenna and to identify a second RSSI value using the second antenna.

Figure 4:
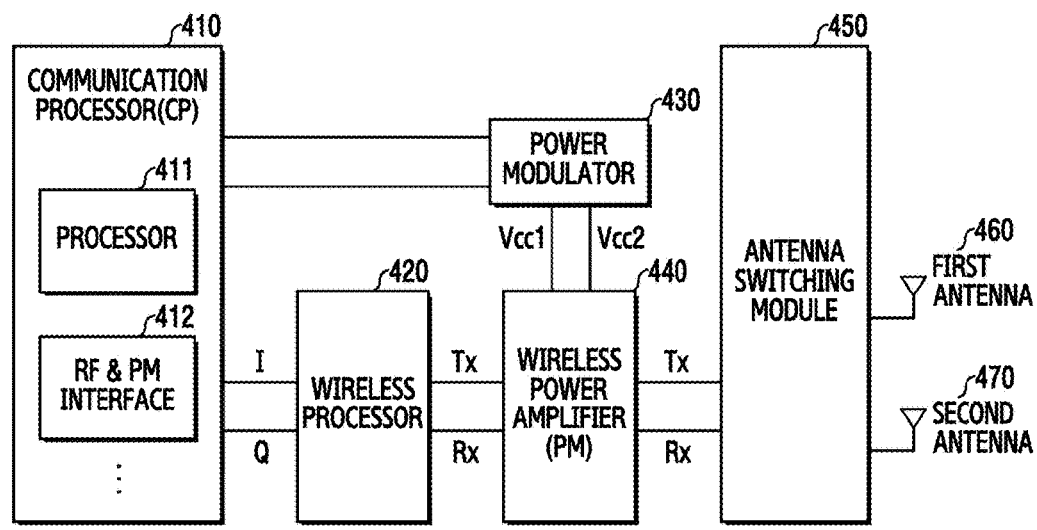
FIG. 4 illustrates a block diagram showing a configuration of a power amplifier according to various embodiments of the present disclosure.

FIG. 4 illustrates a block diagram showing a configuration of a power amplifier according to various embodiments of the present disclosure.

Referring to FIG. 4, according to one embodiment, the power amplifier applying envelope tracking (ET) technology or average power tracking (APT) technology may include a communication processor (CP) 410, a wireless processor 420, a power modulator 430, a wireless power amplifier 440, an antenna switching module 450, a first antenna 460, and a second antenna 470. In the following description, a case in which the ET technology is applied to the power amplifier is referred to as an ET mode, and a case in which the APT technology is applied to the power amplifier is referred to as an APT mode for convenience of explanation. The ET technology may refer to a method of applying a bias voltage optimal to a radio frequency (RF) output signal to the power amplifier in order to reduce power consumption. Accordingly, the power amplifier may operate in the ET mode or the APT mode. However, this should not be considered as limiting.

In one embodiment, the CP 410 may control an overall operation of a communication device and a signal flow between inner components of the communication device, and may process data. For example, the CP 410 may generate and output IQ signals. The IQ signals may refer to a representation of a sine wave signal on a complex number coordinate system. For example, the sine wave signal may be a complex signal and may have a magnitude and a phase. When the complex signal is represented by a Cartesian coordinate system, a real number axis may represent I channel (In-phase) and an imaginary number axis may represent Q channel (Quadrature-phase). That is, a signal transmitted and received at a wireless front end may be an RF signal, and a transmission and reception module (for example, a transceiver) may convert an RF signal into a baseband and then may convert the base band into IQ signals. The CP 410 may generate an envelope corresponding to the generated IQ signals. The CP 410 may determine a mode of the wireless power amplifier 440. For example, the CP 410 may transmit, to the power modulator 430, a control signal for setting the wireless power amplifier 440 to the ET mode or the APT mode. The CP 410 may include a processor 411 which controls the wireless processor 420, the power modulator 430, the wireless power amplifier 440, the antenna switching module 450, the first antenna 460, and the second antenna 470, and an RF & power management (PM) interface 412 which detects an Rx signal, a Tx signal, a power value of the power amplifier, or the like.

In one embodiment, the wireless processor 420 may convert the IQ signals received from the CP 410 into high-frequency signals, and may provide the high-frequency signals to the wireless power amplifier 440 as input signals (Tx, Rx). The wireless processor 420 may include a digital to analogue converter (DAC), a transmission and reception module (for example, a transceiver) or a transmission module (for example, a transmitter), and a reception module (for example, a receiver). In addition, the wireless processor 420 may include one or more of a low noise amplifier for processing an RF signal, a mixer, a drive amplifier, and a converter although they are not illustrated. However, this should not be considered as limiting.

In one embodiment, the power modulator 430 may determine a supply voltage of the wireless power amplifier 440 according to the envelope generated at the CP 410. For example, when the power amplifier operates in the ET mode, the power modulator 430 may supply first supply voltage and current corresponding to an envelope waveform of a radio signal to the wireless power amplifier 440. In addition, when the power amplifier operates in the APT mode, the power modulator 430 may supply a second supply voltage which corresponds to average power of each section in every section of a modulated signal which rolls at every power level of the envelope waveform.

In one embodiment, the wireless power amplifier 440 may amplify input signals (Tx, Rx) received from the first antenna 460 or the second antenna 470 using the supply voltage provided from the power modulator 430, and may output the amplified signals, and may transmit the amplified signals to the antenna switching module 450. For example, the wireless power amplifier 440 may include an input terminal which is connected to an output terminal of the wireless processor 420, and an output terminal which is connected to the antenna switching module 450. The wireless power amplifier 440 may be configured by a power amplifier module (PAM), but is not limited thereto. When the wireless power amplifier 440 is configured by the PAM, and receives a power amplifier (PA) bias value from the power modulator 430, power of the wireless power amplifier 440 may be controlled using power supplied from a battery. However, this should not be considered as limiting.

In one embodiment, an operation range of the wireless power amplifier 440 may include a low power mode (LPM), a mid power mode (MPM), and a high power mode (HPM).

In one embodiment, the antenna switching module 450 may select a low frequency band signal and a high frequency band signal outputted from the wireless power amplifier 440, and may transmit the selected band signal to an antenna. The antenna may radiate the signal selected by the antenna switching module 450 in the air. In addition, in one embodiment, the antenna switching module 450 may utilize a main antenna and a sub antenna, simultaneously, when signal sensitivity of the main antenna is reduced, may change to the sub antenna, or may increase the number of used antennas from among a plurality of antennas included in the main antenna, in consideration of a user's grip state on an electronic device and power consumption. In addition, in one embodiment, the antenna switching module 450 may utilize the main antenna and the sub antenna, simultaneously, when signal sensitivity of the main antenna is reduced, may change to the sub antenna, or may increase the number of used antennas from among the plurality of antennas included in the main antenna, in consideration of a state of the electronic device, such as a state in which the electronic device is placed in an elevator, and power consumption.

In one embodiment, the first antenna 460 may include at least one main antenna for transmitting and receiving a signal for a voice service or a data service. For example, the first antenna 460 may be arranged in a first region (for example, a lower end region of the electronic device) of the electronic device. For example, the first antenna 460 may transmit and receive a signal of a middle frequency band (for example, 1700 MHz-2100 MHz) or a low frequency band (for example, 700 MHz-900 MHz), and may transmit and receive a signal of a high frequency band (for example, 2300 MHz-2700 MHz).

In one embodiment, the second antenna 470 may include at least one sub antenna for receiving a signal for a voice service or a data service. For example, the second antenna 470 may be arranged on a second region (for example, an upper end region of the electronic device) of the electronic device 101. For example, the second antenna 470 may receive a signal of a middle frequency band or a low frequency band. In addition, the second antenna 470 may receive a signal of a high frequency band. Additionally, the second antenna 470 may receive a satellite signal or may transmit or receive a signal for a wireless local area network (LAN) (for example, WiFi).

As described above, the electronic device may have the first antenna 460 arranged in the first region for a multi-antenna diversity or carrier wave direct method, and may have the second antenna 470 arranged on the second region.

Figure 5A:
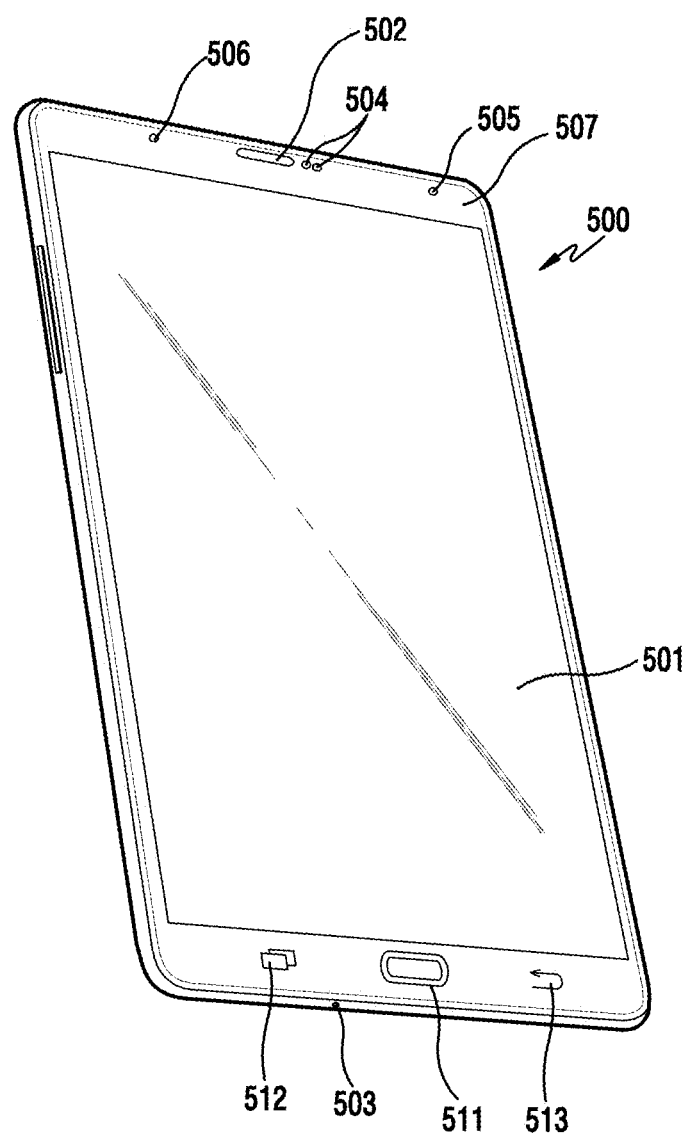
FIG. 5A illustrates a perspective view showing an electronic device according to various embodiments of the present disclosure.

FIG. 5A illustrates a perspective view showing an electronic device according to various embodiments of the present disclosure.

Figure 5B:
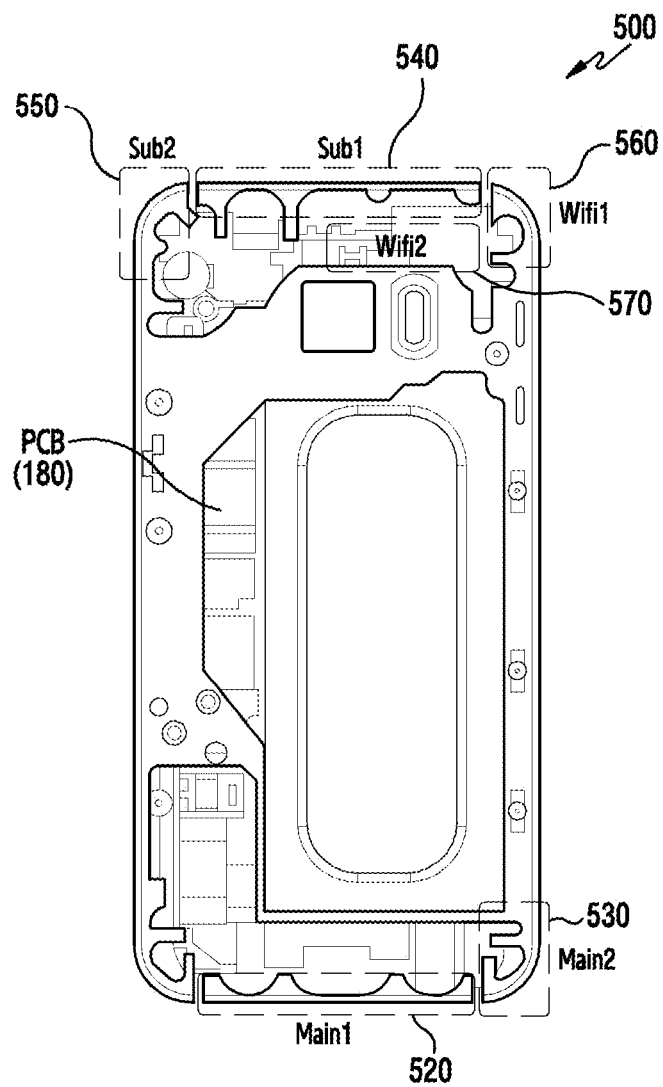
FIG. 5B illustrates an exploded view showing antenna arrangements in an electronic device according to various embodiments of the present disclosure.

FIG. 5B illustrates an exploded view showing antenna arrangements of an electronic device according to various embodiments of the present disclosure.

Referring to FIG. 5A, a display 501 may be installed on a front surface 507 of an electronic device 500.

According to one embodiment, a speaker device 502 may be arranged on an upper side of the display 501 to receive a voice of a person at the other side. A microphone device 503 may be arranged on a lower side of the display 501 to transmit the voice of a user of the electronic device to the other person.

According to one embodiment, the electronic device 500 may include at least one sensor 504 installed on the periphery of the speaker device 502. For example, the sensor 504 may include at least one of an illuminance sensor (for example, a light sensor), a proximity sensor, an infrared sensor, or an ultrasonic sensor.

According to one embodiment, the electronic device 500 may include a camera device 505 installed on the periphery of the speaker device 502. Additionally, the electronic device 500 may include an indicator 506 installed on the periphery of the speaker device 502 to allow the user to recognize state information of the electronic device 500.

According to one embodiment, the electronic device 500 may include buttons 511, 512, 513 arranged on the lower side of the display 501 to detect a user input. For example, the first button 511 may be configured by a hardware button, and the second button 512 and the third button 513 may be configured by a touch pad. For example, the buttons 511, 512, 513 for detecting a user input may be configured as a part of a touch pad or a touch screen.

Referring to FIG. 5B, the electronic device 500 may include a plurality of antenna units 520-570. For example, the plurality of antenna units 520-570 may be arranged on an upper end or a lower end of a printed circuit board (PCB) 580.

According to one embodiment, the first antenna unit 520 and the second antenna unit 530 may include a main antenna for transmitting and receiving a signal for a voice service or a data service. Herein, the main antenna may be the first antenna 460 shown in FIG. 4. For example, the first antenna unit 520 and the second antenna unit 530 may be arranged on the first region (for example, the lower end region of the electronic device) of the electronic device 500. For example, the first antenna unit 520 may transmit and receive a signal of a middle frequency band (for example, 1700 MHz-2100 MHz) or a low frequency band (for example, 700 MHz-900 MHz). The second antenna unit 530 may transmit and receive a signal of a high frequency band (for example, 2300 MHz-2700 MHz) or a middle frequency band. For example, the first antenna unit 520 and the second antenna unit 530 may be physically or logically separated from each other. For example, the main antenna may indicate a reference antenna which is set to transmit and receive a signal in a corresponding frequency band.

According to one embodiment, the third antenna unit 540 and the fourth antenna unit 550 may include a sub antenna for receiving a signal for a voice service or a data service. Herein, the sub antenna may be the second antenna 470 shown in FIG. 4. For example, the third antenna unit 540 and the fourth antenna unit 550 may be arranged on the second region (for example, the upper end of the electronic device) of the electronic device 500. For example, the third antenna unit 540 may receive a signal of a middle frequency band or a low frequency band. The fourth antenna unit 550 may receive a signal of a high frequency band or a middle frequency band. Additionally, the fourth antenna unit 550 may receive a satellite signal. For example, the third antenna unit 540 and the fourth antenna unit 550 may be physically or logically separated from each other. For example, the sub antenna may indicate a reference antenna which is set to receive a signal in a corresponding frequency band.

According to one embodiment, the fifth antenna unit 560 and the sixth antenna unit 570 may transmit and receive a signal for a wireless LAN (for example, WiFi). For example, the fifth antenna unit 560 and the sixth antenna unit 570 may be arranged on the second region (for example, the upper end region of the electronic device) of the electronic device 500.

According to various embodiments of the present disclosure, the electronic device 500 may have the third antenna unit 540 and the fourth antenna unit 550 arranged on the first region, and may have the first antenna unit 520 and the second antenna unit 530 arranged on the second region.

According to various embodiments of the present disclosure, the electronic device 500 may have the first antenna unit 520 and the second antenna unit 530 arranged on a first side surface thereof, and may have the third antenna unit 540 and the fourth antenna unit 550 arranged on a second side surface thereof.

Figure 6:
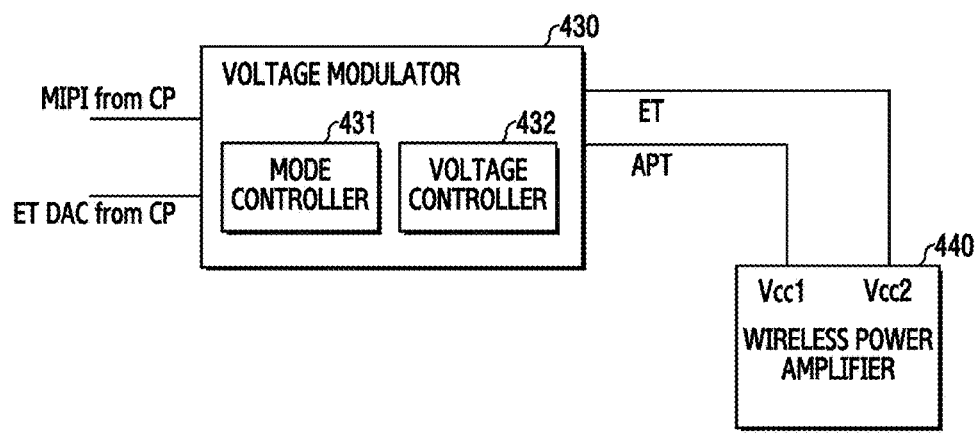
FIG. 6 is a block diagram showing a voltage modulator and a wireless power amplifier according to various embodiments of the present disclosure.

FIG. 6. illustrates a block diagram showing the voltage modulator and the wireless power amplifier according to various embodiments of the present disclosure.

Referring to FIG. 6, in one embodiment, the power modulator 430 may receive a control signal from the CP 410 which is connected according to mobile industry processor interface (MIPI) standard or envelope tracking (ET) digital to analog converter (DAC) settings. In addition, the power modulator 430 may receive an envelope waveform of a radio signal which is modulated to a digital signal to apply an ET mode from the CP 410.

In one embodiment, the power modulator 430 may include a mode controller 431 and a voltage controller 432. The mode controller 431 may set a mode of the wireless power amplifier 440. For example, the mode controller 431 may change the mode of the wireless power amplifier 440 to an ET mode or an APT mode based on a control signal which is received according to a mode determined by the CP 410.

In addition, when it is detected that a noise is generated, when a received signal strength indicator (RSSI) value at each power level differs from a reference value, or when the electronic device is under a weak electric field, the mode controller 431 may change the ET mode to the APT mode. The voltage controller 432 may determine a voltage to be supplied to the wireless power amplifier 440 according to the mode determined at the mode controller 431. For example, in the ET mode, the voltage controller 432 may supply a first supply voltage to the wireless power amplifier 440, and, in the APT mode, the voltage controller 432 may supply a second supply voltage. The first supply voltage may be an alternating current voltage corresponding to an envelope waveform, and the second supply voltage may be a direct current voltage corresponding to average power of each section in every predetermined section of a modulated signal which rolls at every power level of the envelope waveform. However, this should not be considered as limiting.

In one embodiment, the wireless power amplifier 440 may amplify input signals (Tx, Rx) received through the first antenna 460 or the second antenna 470 using the supply voltage provided from the power modulator 430, and may output the amplified signals, and may transmit the amplifier signals to the antenna switching module 450. For example, when the wireless power amplifier 440 is set to the ET mode, the wireless power amplifier 440 may receive the first supply voltage from the power modulator 430 through a first input port Vcc1, and, when the wireless power amplifier 440 is set to the APT mode, the wireless power amplifier 440 may receive the second supply voltage from the power modulator 430 through a second input port Vcc2. The first input port Vcc1 of the wireless power amplifier 440 may be a structure that does not include a capacitor for removing a noise. However, this should not be considered as limiting.

Figure 7:
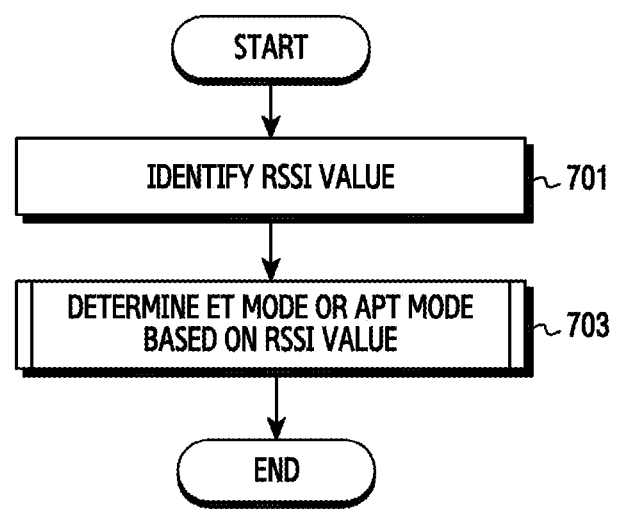
FIG. 7 illustrates a flowchart showing an operation method of a power amplifier according to one embodiment of the present disclosure.

FIG. 7 illustrates a flowchart showing an operation method of a power amplifier according to one embodiment of the present disclosure.

Referring to FIG. 7, in one embodiment, the processor 210 may identify an RSSI in operation 701. For example, the processor 210 may identify a state and quality of a signal received through an antenna, and the RSSI may be one of the indexes indicating the state and quality of a received signal. However, this should not be considered as limiting. For example, it is common that an RSSI value indicates sensitivity of about −100 dB in the case of LTE, sensitivity of about −110 dB in the case of 3G, or sensitivity of about −120 dB in the case of 2G.

The processor 210 may control the operation of the CP 410. For convenience of explanation, the operation controlled by the processor 210 will be described.

In one embodiment, in operation 703, the processor 210 may determine a first power amplification mode or a second power amplification mode based on the RSSI value. The first power amplification mode may be an ET mode, and the second power amplification mode may be an APT mode. The ET mode may include an operation of amplifying power of a transmission signal using a first supply voltage which is generated based on an envelope signal of the transmission signal, and the APT mode may include an operation of amplifying power of a transmission signal using a second supply voltage which is generated based on an average of an amplitude component of an envelope signal of the transmission signal. That is, the processor 210 may set a mode of the power amplifier to the ET mode or the APT mode. For example, when the wireless power amplifier 440 operates in a low power mode or a mid power mode, the processor 210 may determine the mode of the power amplifier to the APT mode. On the other hand, when the wireless power amplifier 440 operates in a low-power mode, the processor 210 may determine the mode of the power amplifier to the ET mode. For example, in the high power mode, the wireless power amplifier 440 may operate with high power of about 18 dB or more, and a voltage value supplied to the power amplifier may be higher than in the low power mode or the mid power mode. Such a high power mode may operate under a weak electric field. Accordingly, since the high power mode requires high output as much as that, the ET mode may be applied to minimize power consumption.

In one embodiment, when the ET mode is set and the measured RSSI value differs from a reference value, the processor 210 may change the ET mode to the APT mode. When a radio band noise (Rx band noise (RxBN)) is generated, the measured RSSI value may differ from the reference value. That is, when the ET mode is applied, degradation of sensitivity caused by the RxBN may occur, and the degradation of sensitivity may be detected when the RSSI value differs from the reference value. This is because the RSSI value is reduced as a noise is generated. In addition, a noise generated by a voltage supplied to the power amplifier may enter through the first antenna 460 or the second antenna 470, and accordingly, the degradation of sensitivity may occur.

As described above, the input terminal of the wireless power amplifier 440 to which the first power voltage applying the ET mode is supplied may not include a capacitor for removing a noise, and accordingly, the input terminal of the wireless power amplifier 440 may be more vulnerable to a noise, and the input terminal of the wireless power amplifier 440 to which the second supply voltage applying the APT mode is supplied may include a capacitor for removing a noise and thus may be resistant to a noise. Accordingly, the processor 210 may prevent the degradation of sensitivity which is caused by a noise by changing the ET mode to the APT mode. Changing between the ET mode and the APT mode may be performed in real time. Changing the mode will be described in detail below with reference to FIGS. 8 to 10.

After operation 703, the processor 210 may stop the operation of determining the mode or may repeat operations 701 and 703.

Figure 8:
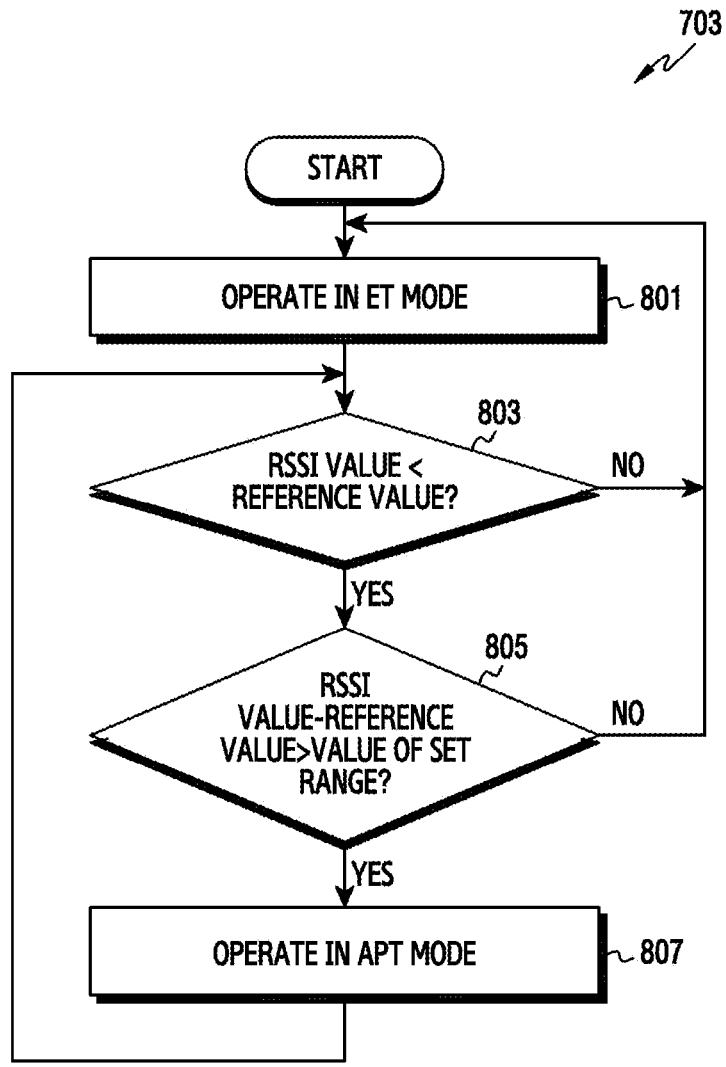
FIG. 8 illustrates a flowchart showing a method for switching between an envelope tracking (ET) mode and an average power tracking (APT) mode according to one embodiment of the present disclosure.

FIG. 8 illustrates a flowchart showing a method for switching between an ET mode and an APT mode according to one embodiment of the present disclosure. According to certain embodiments, operation 703 of FIG. 7 may be performed by the method illustrated in FIG. 8.

Referring to FIG. 8, in one embodiment, the power amplifier may operate in the ET mode in operation 801. For example, when the wireless power amplifier 440 operates in a high power mode under a weak electric field, the processor 210 may set the power amplifier to the ET mode. However, this should not be considered as limiting.

In one embodiment, in operation 803, the processor 210 may compare an RSSI value which is measured after the power amplifier is set to the ET mode, and a reference value. For example, when a noise is not generated, the reference value may indicate sensitivity of about −100 dB in the case of LTE, sensitivity of about −110 dB in the case of 3G, or sensitivity of about −120 dB in the case of 2G. Accordingly, when the measured RSSI value is less than the reference value, it may be determined that a noise is generated in a received signal. However, this should not be considered as limiting.

The measured RSSI value in FIG. 7 may be a value which is measured at the first antenna 460. The processor 210 may determine whether a noise is currently generated only based on the RSSI value measured at the first antenna. However, this should not be considered as limiting.

In one embodiment, when the RSSI value is greater than or equal to the reference value in operation 803, the processor 210 may maintain the mode of the power amplifier as the ET mode (operation 801).

In one embodiment, when the measured RSSI value is smaller than the reference value, the processor 210 may compare a difference value between the measured RSSI value and the reference value and a set range value in operation 805. In general, when a user grips the electronic device, the RSSI value may have a difference of about 5-10 dB from the reference value. In addition, when a noise is generated in the ET mode, the RSSI value may have a difference of about 15-20 dB from the reference value. Therefore, when the RSSI value differs from the reference value, the difference may not mean that a noise is generated, but may mean that the user simply grips the electronic device. Accordingly, to distinguish between a situation in which the user grips the electronic device and a situation in which a noise is generated, the processor 210 may compare the difference value between the measured RSSI value and the reference value, and the set range value. For example, the set range value may be 10-15 dB. That is, the set range value may be set to be higher than a difference value between an RSSI value detected in a grip situation and the reference value, such that the situation in which the user grips the electronic device and the situation in which a noise is generated are distinguished from each other.

In one embodiment, when the measured RSSI value is lower than the reference value and the difference value between the RSSI value and the reference value is greater than the set range value, the processor 210 may set the power amplifier applying the ET mode to operate in the APT mode. That is, when it is determined that a noise is generated, the processor 210 may change the ET mode to the APT mode. For example, the processor 210 may change the ET mode which is applied in response to the wireless power amplifier 440 operating in the high power mode to the APT mode. Accordingly, the processor 210 in the high power mode of the wireless power amplifier 440 may set the power amplifier to the APT mode, thereby minimizing the generated noise.

In one embodiment, the processor 210 may repeat operation 803 even after changing to the APT mode. When the measured RSSI value is greater than or equal to the reference value, the processor 210 may change to the ET mode, and, when the measured RSSI value is still less than the reference value, the processor 210 may maintain the APT mode.

According to one embodiment of the present disclosure, operation 805 may be omitted, and, when the measured RSSI value is less than the reference value, the processor 210 may change the ET mode to the APT mode in real time. However, this should not be considered as limiting.

Figure 9:
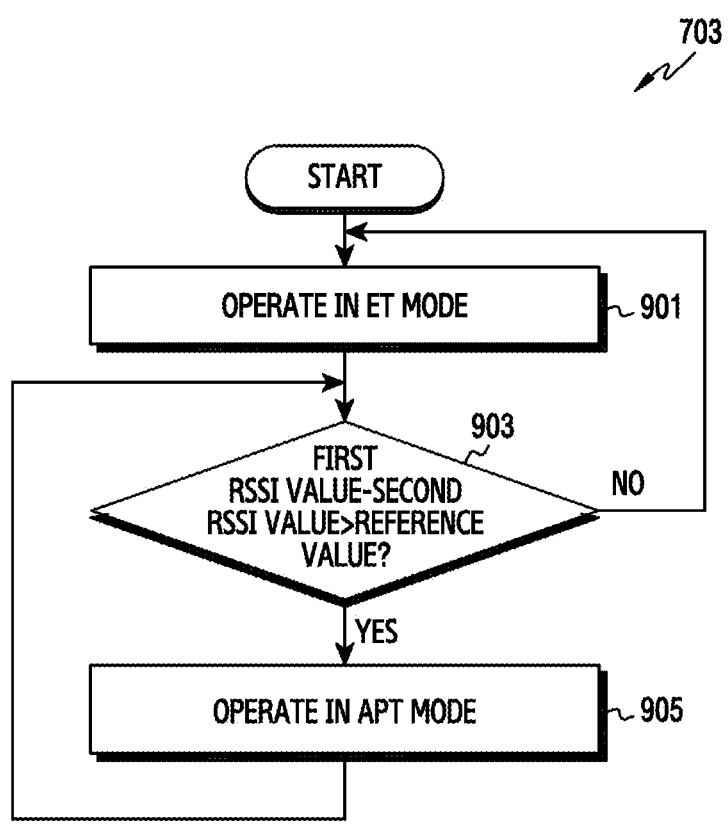
FIG. 9 illustrates a flowchart showing a method for switching between an ET mode and an APT mode according to another embodiment of the present disclosure.

FIG. 9 illustrates a flowchart showing a method for switching between an ET mode and an APT mode according to another embodiment of the present disclosure. According to certain embodiments, operation 703 of FIG. 7 may be performed by the method illustrated in FIG. 9.

Referring to FIG. 9, in one embodiment, the power amplifier may operate in the ET mode in operation 901. For example, when the wireless power amplifier 440 operates in a high power mode under a weak electric field, the processor 210 may set the power amplifier to the ET mode. However, this should not be considered as limiting.

In one embodiment, in operation 903, the processor 210 may compare a difference value between a first RSSI value and a second RSSI value which are measured after the power amplifier is set to the ET mode, and a reference value. The first RSSI value may be a value which is measured at the first antenna 460 and the second RSSI value may be a value which is measured at the second antenna 470. It is common that, when the electronic device is under a situation of a weak electric field, for example, in an elevator, the first antenna 460 and the second antenna 470 may reduce the RSSI value corresponding to a reception level, simultaneously. However, when a noise is generated, only the RSSI value of the first antenna 460 corresponding to a main antenna may be reduced. Accordingly, a difference value between the first RSSI value and the second RSSI value may be used to distinguish between a situation in which the electronic device is under a weak electric field, for example, in an elevator, and a situation in which a noise is generated.

In one embodiment, it is common that the RSSI value may be reduced by about 15-20 dB when a noise is generated. Accordingly, the reference value may be set to 15-20 dB by which the RSSI value is reduced. When the difference value between the first RSSI value and the second RSSI value is greater than the reference value, it may be determined that a noise is generated. However, this should not be considered as limiting.

In one embodiment, when the difference value between the first RSSI value and the second RSSI value is less than or equal to the reference value, the electronic device 201 may maintain the mode of the power amplifier as the ET mode (operation 801).

On the other hand, in one embodiment, when the difference value between the first RSSI value and the second RSSI value is equal to the reference value, the processor 210 may determine that a noise is generated. That is, when the difference value between the first RSSI value and the second RSSI value is equal to the reference value, the processor 210 may change or maintain the ET mode according to settings. However, this should not be considered as limiting.

In one embodiment, when the difference value between the first RSSI value and the second RSSI value is greater than the reference value, the processor 210 may set the power amplifier applying the ET mode to operate in the APT mode in operation 905. That is, when it is determined that a noise is generated, the processor 210 may change the ET mode to the APT mode. For example, the processor 210 may change the ET mode which is applied in response to the wireless power amplifier 440 operating in the high power mode to the APT mode. Accordingly, the processor 210 in the high power mode of the wireless power amplifier 440 may set the power amplifier to the APT mode, thereby minimizing the generated noise.

In one embodiment, the processor may repeat operation 903 even after changing to the APT mode. The processor 210 may change the mode to the ET mode when the difference value between the first RSSI value and the second RSSI value is less than or equal to the reference value, and may maintain the APT mode when the difference value between the first RSSI value and the second RSSI value is still greater than the reference value.

Figure 10:
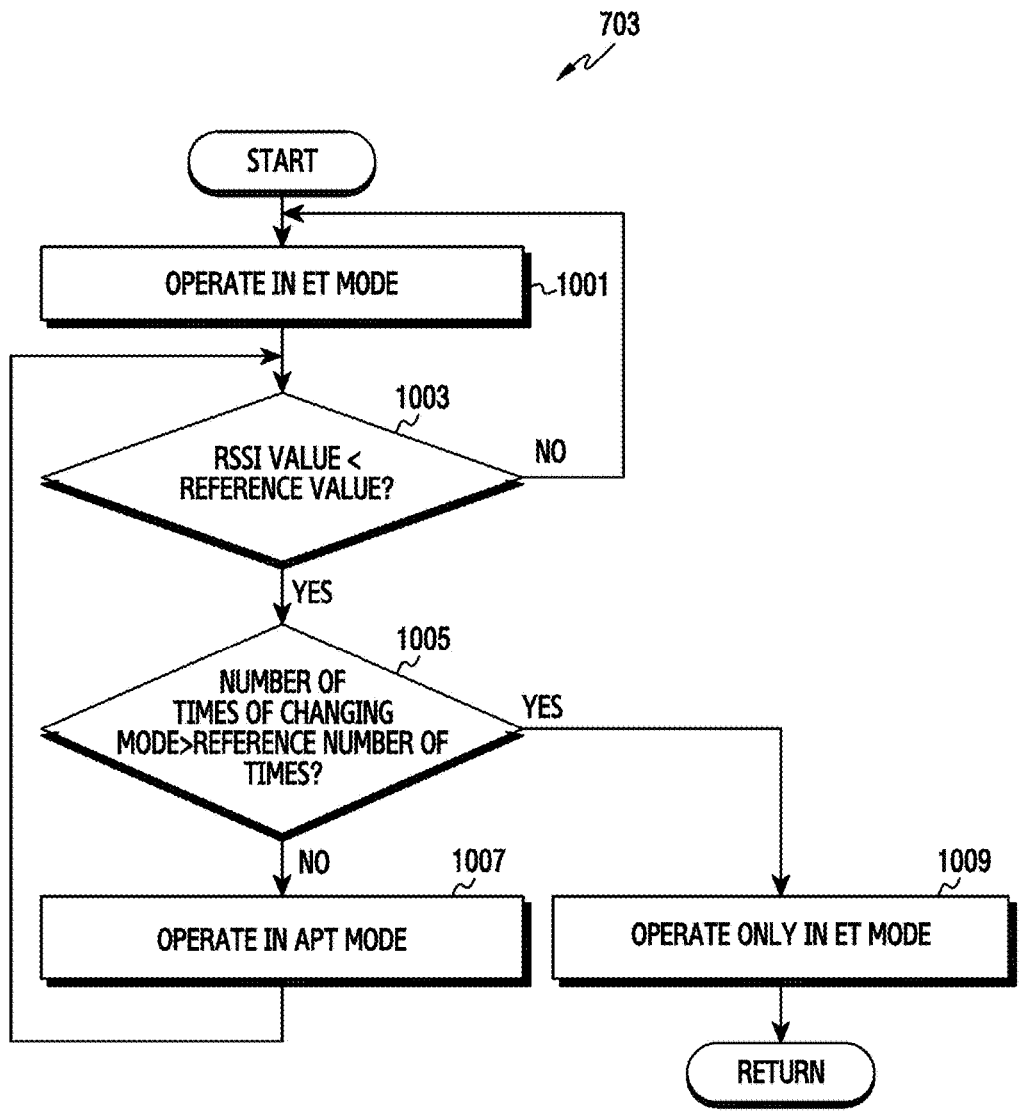
FIG. 10 illustrates a flowchart showing a method for switching between an ET mode and an APT mode according to still another embodiment of the present disclosure.

FIG. 10 illustrates a flowchart showing a method for switching between an ET mode and an APT mode according to still another embodiment of the present disclosure.

Referring to FIG. 10, in one embodiment, the power amplifier may operate in the ET mode in operation 1001. For example, when the wireless power amplifier 440 operates in a high-power mode under a weak electric field, the processor 210 may set the power amplifier to the ET mode. However, this should not be considered as limiting.

In one embodiment, in operation 1003, the processor 210 may compare an RSSI value which is measured after the power amplifier is set to the ET mode and a reference value. For example, when a noise is not generated, the reference value may indicate sensitivity of about −100 dB in the case of LTE, sensitivity of about −110 dB in the case of 3G, or sensitivity of about −120 dB in the case of 2G. Accordingly, when the measured RSSI value is less than the reference value, it may be determined that a noise is generated in a received signal. However, this should not be considered as limiting.

The measured RSSI value in FIG. 8 may be a value which is measured at the first antenna 460. The processor 210 may determine whether a noise is currently generated based only the RSSI value measured at the first antenna. However, this should not be considered as limiting.

In one embodiment, when the RSSI value is greater than or equal to the reference value, the processor 210 may maintain the mode of the power amplifier as the ET mode.

In one embodiment, in operation 1005, the processor 210 may compare the number of times the mode is changed and a reference number of times. That is, the processor 210 may detect how many times the ET mode and the APT mode are changed within a predetermined time, and may compare the number of times the mode is changed and the reference number of times. However, this should not be considered as limiting.

When the number of times the mode is changed exceeds the reference number of times, the processor 210 may stop changing the mode and may fix the ET mode in operation 1009. This is to prevent power consumption caused by the change of the mode. For example, when the mode is changed two or more times within five seconds, the processor 210 may stop changing the mode. However, this should not be considered as limiting, and the reference number of times may be determined in consideration of minimization of a noise and power consumption.

When a predetermined time elapses after the ET mode is fixed in operation 1009, operation 1003 may be resumed. That is, in situations where the mode is changed more than the reference number of times, operations 1003-1007 may be repeated. However, this should not be considered as limiting.

In one embodiment, when the measured RSSI value is less than the reference value and the number of times the mode is changed is less than or equal to the reference number of times, the processor 210 may set the power amplifier applying the ET mode to operate in the APT mode in operation 1007. That is, when it is determined that a noise is generated, the processor 210 may change the ET mode to the APT mode. For example, the processor 210 may change the ET mode which is applied in response to the wireless power amplifier 440 operating in the high power mode to the APT mode. Accordingly, the processor 210 in the high power mode of the wireless power amplifier 440 may set the power amplifier to the APT mode, thereby minimizing the generated noise.

In one embodiment, the processor 210 may repeat operation 1003 even after changing to the APT mode. When the measured RSSI value is greater than or equal to the reference value, the processor 210 may change to the ET mode, and, when the measured RSSI value is still less than the reference value, the processor 210 may maintain the APT mode. However, this should not be considered as limiting.

In one embodiment, in operation 1005, the processor 210 may consider a battery state of a terminal, in addition to the number of times the mode is changed and the reference number of times, and may determine to operate only in the ET mode. For example, when the battery state of the terminal is 10% or less, the processor 210 may fix the power amplifier to the ET mode without changing the mode in order to minimize power consumption.

According to various embodiments of the present disclosure, an operation method of an electronic device may include: identifying an RSSI value; and setting a power amplifier to a first power amplification mode or a second power amplification mode based on the identified one or more RSSI value, and the first power amplification mode and the second power amplification mode may supply different supply voltages to the power amplifier.

In one embodiment, the first power amplification mode may be an ET mode, and the second power amplification mode may be an APT mode. The ET mode may include a mode in which power of a transmission signal is amplified using a first supply voltage which is generated based on an envelope signal of the transmission signal, and the APT mode may include a mode in which the power of the transmission signal is amplified using a second supply voltage which is generated based on an average of an amplitude component of the envelope signal of the transmission signal.

In one embodiment, setting the power amplifier may include: setting the power amplifier to the first power amplification mode; comparing the identified RSSI value and a reference value; and, when the identified RSSI value is less than the reference value, changing the power amplifier to the second power amplification mode.

In one embodiment, setting the power amplifier may further include, when the identified RSSI value is greater than or equal to the reference value, maintaining the first power amplification mode of the power amplifier.

In one embodiment, setting the power amplifier may further include: comparing an RSSI value which is identified after the power amplifier is set to the second power amplification mode, and the reference value; and. when the RSSI value which is identified after the power amplifier is set to the second power amplification mode is greater than or equal to the reference value, changing the power amplifier to the first power amplification mode.

In one embodiment, setting the power amplifier may include: setting the power amplifier to the first power amplification mode; comparing the identified RSSI value and a reference value; comparing a difference value between the identified RSSI value and the reference value and a value within a predetermined range; when the identified RSSI value is less than the reference value and the difference value is greater than the value within the predetermined range, setting the power amplifier to the second power amplification mode; and, when the identified RSSI value is less than the reference value and the difference value is the value within the predetermined range, maintaining the power amplifier in the first power amplification mode.

In one embodiment, setting the power amplifier may include: setting the power amplifier to the first power amplification mode; detecting a difference value between a first RSSI value and a second RSSI value which are identified; comparing the difference value between the first RSSI value and the second RSSI value and a reference value; and, when the difference value between the first RSSI value and the second RSSI value is greater than the reference value, changing the power amplifier to the second power amplification mode.

In one embodiment, setting the power amplifier may further include, when the difference value between the first RSSI value and the second RSSI value is less than or equal to the reference value, maintaining the power amplifier in the first power amplification mode.

In one embodiment, setting the power amplifier may further include: detecting a difference value between a first RSSI value and a second RSSI value which are identified after the power amplifier is set to the second power amplification mode; comparing the difference value which is detected after the power amplifier is set to the second power amplification mode and the reference value; and, when the difference value which is detected after the power amplifier is set to the second power amplification mode is less than or equal to the reference value, changing the power amplifier to the first power amplification mode.

In one embodiment, setting the power amplifier may further include, when a number of times a mode is changed to the APT mode or the ET mode for a predetermined time is greater than or equal to a reference number of times, selecting the ET mode.

The present disclosure was described hereinabove based on preferred embodiments. It will be understood by a person skilled in the related art that the present disclosure may be implemented in a changed form without departing from essential features of the present disclosure. Therefore, disclosed embodiments should be considered from a descriptive perspective rather than from a limited perspective. The scope of the present disclosure is disclosed in the claims rather than in the above description, and all differences within the scope equivalent thereto should be interpreted as being included in the present disclosure.

The method according to various embodiments of the present disclosure and the electronic device supporting the same may change the power amplifier from the ET mode to the APT mode in real time when generation of a noise is detected, and may minimize the noise while reducing power consumption of the power amplifier.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An operation method of an electronic device, the method comprising:
   identifying a received signal strength indicator (RSSI) value; and
   setting a power amplifier to a first power amplification mode or a second power amplification mode based on the identified RSSI value,
   wherein the first power amplification mode and the second power amplification mode supply different supply voltages to the power amplifier,
   wherein setting the power amplifier comprises:
      setting the power amplifier to the first power amplification mode,
      comparing the identified RSSI value with a first reference value,
      comparing a difference value between the identified RSSI value and the first reference value with a value within a predetermined range,
      when the identified RSSI value is less than the first reference value and the difference value is greater than the value within the predetermined range, setting the power amplifier to the second power amplification mode, and
      when the identified RSSI value is less than the first reference value and the difference value is the value within the predetermined range, maintaining the power amplifier in the first power amplification mode,
   wherein the first power amplification mode is an envelope tracking (ET) mode, and the second power amplification mode is an average power tracking (APT) mode.

2. The method of claim 1,
   wherein the ET mode comprises a mode in which power of a transmission signal is amplified using a first supply voltage that is generated based on an envelope signal of the transmission signal, and
   wherein the APT mode comprises a mode in which the power of the transmission signal is amplified using a second supply voltage that is generated based on an average of an amplitude component of the envelope signal of the transmission signal.

3. The method of claim 1, wherein setting the power amplifier further comprises:
   comparing the RSSI value that is identified after the power amplifier is set to the second power amplification mode, and the first reference value; and
   when the RSSI value that is identified after the power amplifier is set to the second power amplification mode is greater than or equal to the first reference value, changing the power amplifier to the first power amplification mode.

4. The method of claim 1, further comprising:
   identifying a plurality of received signal strength indicator values including a first RSSI value and a second RSSI value;
   detecting a difference value between the first RSSI value and the second RSSI value which are identified;
   comparing the difference value between the first RSSI value and the second RSSI value with a second reference value; and
   when the difference value between the first RSSI value and the second RSSI value is greater than the second reference value, changing the power amplifier to the second power amplification mode.

5. An electronic device comprising:
   an antenna functionally connected to the electronic device; and
   a processor configured to identify a received signal strength indicator (RSSI) value using the antenna, and set a power amplifier to a first power amplification mode or a second power amplification mode based on the identified RSSI value,
   wherein the first power amplification mode and the second power amplification mode supply different supply voltages to the power amplifier,
   wherein the processor is further configured to:
      set the power amplifier to the first power amplification mode,
      compare the identified RSSI value with a first reference value,
      compare a difference value between the identified RSSI value and the first reference value with a value within a predetermined range,
      when the identified RSSI value is less than the first reference value and the difference value is greater than the value within the predetermined range, set the power amplifier to the second power amplification mode, and when the identified RSSI value is less than the first reference value and the difference value is the value within the predetermined range, maintain the power amplifier in the first power amplification mode, wherein the first power amplification mode is an envelope tracking (ET) mode, and the second power amplification mode is an average power tracking (APT) mode.

6. The electronic device of claim 5, wherein the processor is configured to, in the ET mode, amplify power of a transmission signal using a first supply voltage that is generated based on an envelope signal of the transmission signal, and, in the APT mode, to amplify the power of the transmission signal using a second supply voltage that is generated based on an average of an amplitude component of the envelope signal of the transmission signal.

7. The electronic device of claim 6, wherein the processor is further configured to:

identify a plurality of received signal strength indicator values including a first RSSI value and a second RSSI value, detect a difference value between the first RSSI value and the second RSSI value which are identified, compare the difference value between the first RSSI value and the second RSSI value with a second reference value, and when the difference value between the first RSSI value and the second RSSI value is greater than the second reference value, to change the power amplifier to the second power amplification mode.

8. The electronic device of claim 7, wherein the processor is configured to, when the difference value between the first RSSI value and the second RSSI value is less than or equal to the second reference value, maintain the power amplifier in the first power amplification mode.

9. The electronic device of claim 7, wherein the processor is configured to:

detect a difference value between the first RSSI value and the second RSSI value that are identified after the power amplifier is set to the second power amplification mode, compare the difference value that is detected after the power amplifier is set to the second power amplification mode with the second reference value, and when the difference value which is detected after the power amplifier is set to the second power amplification mode is less than or equal to the second reference value, to change the power amplifier to the first power amplification mode.

10. The electronic device of claim 5, wherein the processor is configured to:

compare the RSSI value that is identified after the power amplifier is set to the second power amplification mode, and the first reference value, and, when the RSSI value that is identified after the power amplifier is set to the second power amplification mode is greater than or equal to the first reference value, to change the power amplifier to the first power amplification mode.

11. The electronic device of claim 5, wherein the processor is configured to, when a number of times a mode is changed to the APT mode or the ET mode for a predetermined time is greater than or equal to a reference number of times, select the ET mode.

12. The electronic device of claim 5, wherein the antenna comprises a first antenna and a second antenna.

13. The electronic device of claim 12, wherein the processor is configured to identify the RSSI value using at least one of the first antenna and the second antenna.

14. The electronic device of claim 12, wherein the processor is configured to identify a first RSSI value using the first antenna and to identify a second RSSI value using the second antenna.

* * * * *